US010879106B2

(12) United States Patent
Lillibridge

(10) Patent No.: US 10,879,106 B2
(45) Date of Patent: Dec. 29, 2020

(54) APPARATUS WITH OVERLAPPING DEEP TRENCH AND SHALLOW TRENCH AND METHOD OF FABRICATING THE SAME WITH LOW DEFECT DENSITY

(71) Applicant: Texas Instruments Incorporated, Dallas, TX (US)

(72) Inventor: Thomas Edward Lillibridge, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/901,449

(22) Filed: Feb. 21, 2018

(65) Prior Publication Data
US 2019/0259651 A1 Aug. 22, 2019

(51) Int. Cl.
*H01L 21/762* (2006.01)
*H01L 29/40* (2006.01)
*H01L 21/02* (2006.01)
*H01L 29/06* (2006.01)
*H01L 21/308* (2006.01)

(52) U.S. Cl.
CPC .. *H01L 21/76229* (2013.01); *H01L 21/02269* (2013.01); *H01L 21/3081* (2013.01); *H01L 29/0649* (2013.01); *H01L 29/407* (2013.01)

(58) Field of Classification Search
None
See application file for complete search history.

(56) References Cited

U.S. PATENT DOCUMENTS

| | | | | |
|---|---|---|---|---|
| 6,110,797 A | * | 8/2000 | Perry | H01L 21/76232 257/E21.546 |
| 2012/0018840 A1 | * | 1/2012 | Kang | H01L 21/76232 257/508 |
| 2016/0336184 A1 | | 11/2016 | Grivna et al. | |
| 2016/0379982 A1 | | 12/2016 | You et al. | |
| 2017/0213913 A1 | | 7/2017 | Lee et al. | |

OTHER PUBLICATIONS

PCT Search Report for Application No. PCT/US 2019/019005, dated May 23, 2019.

* cited by examiner

*Primary Examiner* — Hrayr A Sayadian
(74) *Attorney, Agent, or Firm* — Andrew R. Ralston; Charles A. Brill; Frank D. Cimino

(57) ABSTRACT

A method for fabricating conductive deep trenches in conjunction with shallow trench isolations in a semiconductor device. The disclosed method introduces an integrated sequence during which a shallow trench is etched and filled before a deep trench is etched and filled. The disclosed method advantageously reduces cone defects and process complexity associated with the formation of a conductive deep trench within a shallow trench isolation structure. Fabricated under the integrated sequence, the conductive deep trench may extend through a shallow trench dielectric layer and into the substrate, where the top surfaces of both the conductive deep trench and shallow trench dielectric layer are substantially cone free.

20 Claims, 10 Drawing Sheets

APPARATUS WITH OVERLAPPING DEEP TRENCH AND SHALLOW TRENCH AND METHOD OF FABRICATING THE SAME WITH LOW DEFECT DENSITY

BACKGROUND

Conductive deep trenches are deployed in high power semiconductor devices with multiple applications. In an integrated circuit die, conductive deep trenches may serve as isolation barriers that segregate high voltage components from low voltage components. In a discrete component, conductive deep trenches may serve as field plates and gate electrodes for high power transistors. Conductive deep trenches can be formed alongside with shallow trench isolations, such that one or more conductive deep trenches may overlap within a shallow trench isolation structure. However, the process for fabricating trenches with different depths can be complex and defect-prone.

SUMMARY

The present disclosure describes techniques for fabricating conductive deep trenches in conjunction with shallow trench isolations in a semiconductor device. The disclosed techniques introduce an integrated sequence during which a shallow trench is etched and filled before a deep trench is etched and filled. The disclosed techniques advantageously reduce cone defects along a top surface of the shallow trench isolation structures, thereby minimizing the defect density of a semiconductor device. And by integrating the deep trench formation process with the shallow trench formation process, the disclosed techniques advantageously reduce the process complexity of fabricating a semiconductor device.

In one implementation, for example, the present disclosure introduces a method that comprises forming a shallow trench in a first region of a substrate, forming a dielectric layer filling the shallow trench and covering the substrate, and forming a deep trench in a second region within the first region of the substrate. Before the deep trench is formed, the dielectric layer has a substantially planar surface over and across the shallow trench. And after the deep trench is formed, it extends from and penetrates through the dielectric layer.

In another implementation, for example, the present disclosure introduces a method that comprises forming a shallow trench in a first region of a substrate, forming a shallow trench oxide layer filling the shallow trench, forming a hard mask layer covering the shallow trench oxide layer, and forming a deep trench in a second region within the first region of the substrate. Before the deep trench is formed, the hard mask layer having a substantially planar surface. And after the deep trench is formed, it extends from and penetrates through the shallow trench oxide layer.

In yet another implementation, for example, the present disclosure introduces a device that comprises a substrate having a surface aligning along a plane, a shallow trench dielectric layer extending from the plane into the substrate by a first depth, and a deep trench structure extending from the plane, through the shallow trench dielectric layer, and into the substrate by a second depth greater than the first depth.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Deep trench structures can be found in many semiconductor devices, such as high voltage analog devices. In high voltage applications, a deep trench structure may include a conductive filler, which can serve as a field plate for reducing electric field density, or as a gate electrode of a vertical transistor (e.g., a vertical diffused MOS (VDMOS) transistor). Deep trench structures can be formed in conjunction with shallow trench structures. As shown in FIGS. 1A-1G, for example, a semiconductor device 100 can be fabricated under a sequence that forms a deep trench 122 before forming a shallow trench 133.

Figure 1A:
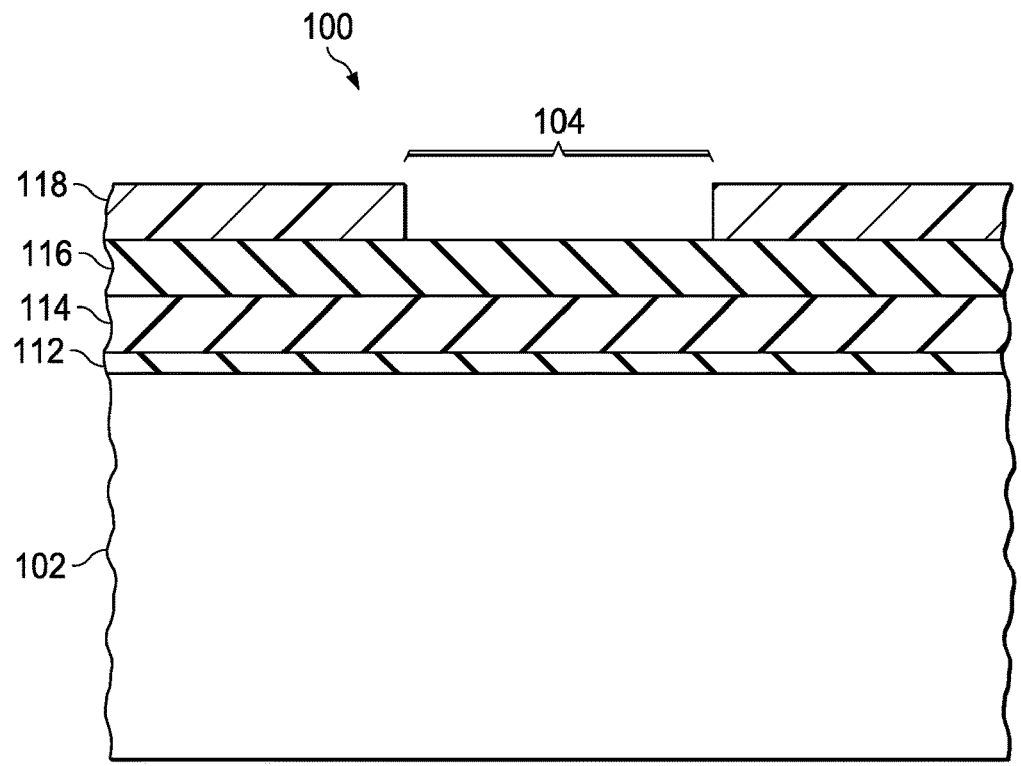
FIGS. 1A-1G show the partial cross-sectional views of a semiconductor device during a process for fabricating a deep trench followed by a shallow trench with cone defects.

Referring to FIG. 1A, the semiconductor device 100 can be a discrete component device (e.g., a single transistor device) or an integrated circuit having multiple transistor devices. At an early stage of the fabrication sequence, a pad oxide layer 112, a nitride cap layer 114, and a hard mask layer 116 are sequentially formed on a top surface of a semiconductor substrate 102. The pad oxide layer 112 servers the function of stress relief between the silicon and subsequent layers, and it may include silicon dioxide that is grown in a thermal oxidation process. The nitride cap layer 114 servers the function of exclusionary film allowing selective oxidation, and it may include silicon nitride (e.g., $Si_3N_4$) that is deposited under a Low Pressure Chemical Vapor Deposition (LPCVD) furnace process. The hard mask layer 116 servers the function of a hard mask during the subsequent Deep Trench etch process, and it may include silicon dioxide that is deposited under a Plasma Enhanced Chemical Vapor Deposition (PECVD) process.

Next, a photoresist mask 118 is deposited and patterned with an opening exposing a deep trench (DT) region 104 of the substrate 102. The photoresist mask 118 servers the function of masking the hard mask layer, and it may include a light sensitive organic material that is coated, exposed, and developed.

Figure 1B:
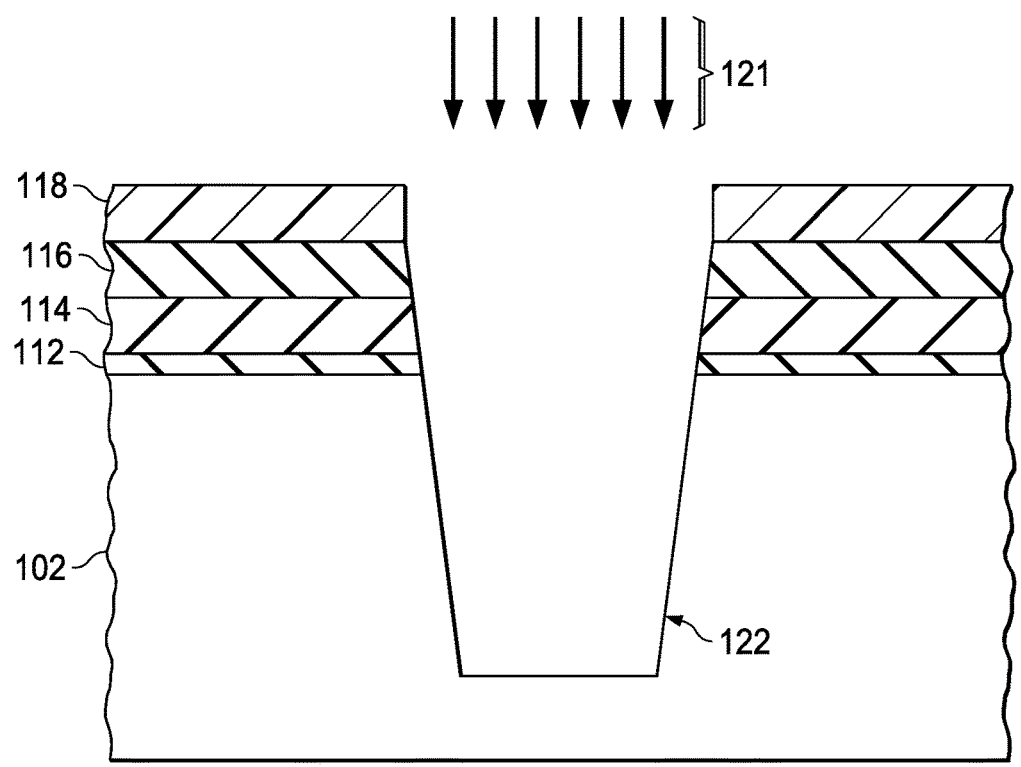

Referring to FIG. 1B, a DT etch process 121 is performed to form a deep trench 122. The DT etch process 121 may include multiple subsequences. In one implementation, for example, a hard mask etch may be first performed to remove the hard mask layer 116 exposed by the patterned photoresist mask 118, and a silicon etch may then be performed to remove the nitride cap layer 114, the pad oxide layer 112, and the substrate 102 that are exposed by the etched hard mask layer 116. During the silicon etch, the photoresist mask layer 118 is also removed, leaving the hard mask layer 116 to prevent the area outside of the DT region 104 from being etched.

Figure 1C:
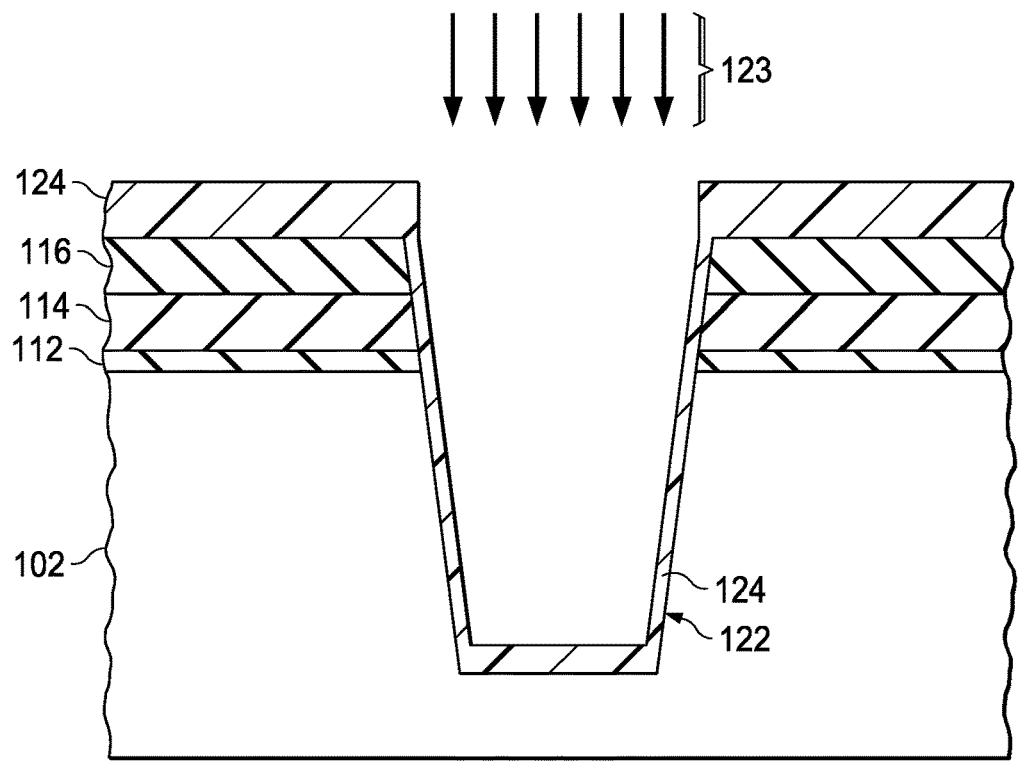

After the DT etch process 121, a dielectric liner deposition process is performed to cover the sidewalls of the deep trench 122. As shown in FIG. 1C, for example, a DT oxide liner 124 is deposited onto the sidewall of the deep trench 122 under a dielectric liner deposition process 123. In one implementation, the dielectric liner deposition 123 may include a sub-atmospheric chemical vapor deposition of an oxide target. The dielectric liner deposition process 123 may be followed by a deep trench dielectric etch process to achieve uniform liner thickness along the sidewall of the deep trench 122.

Figure 1D:
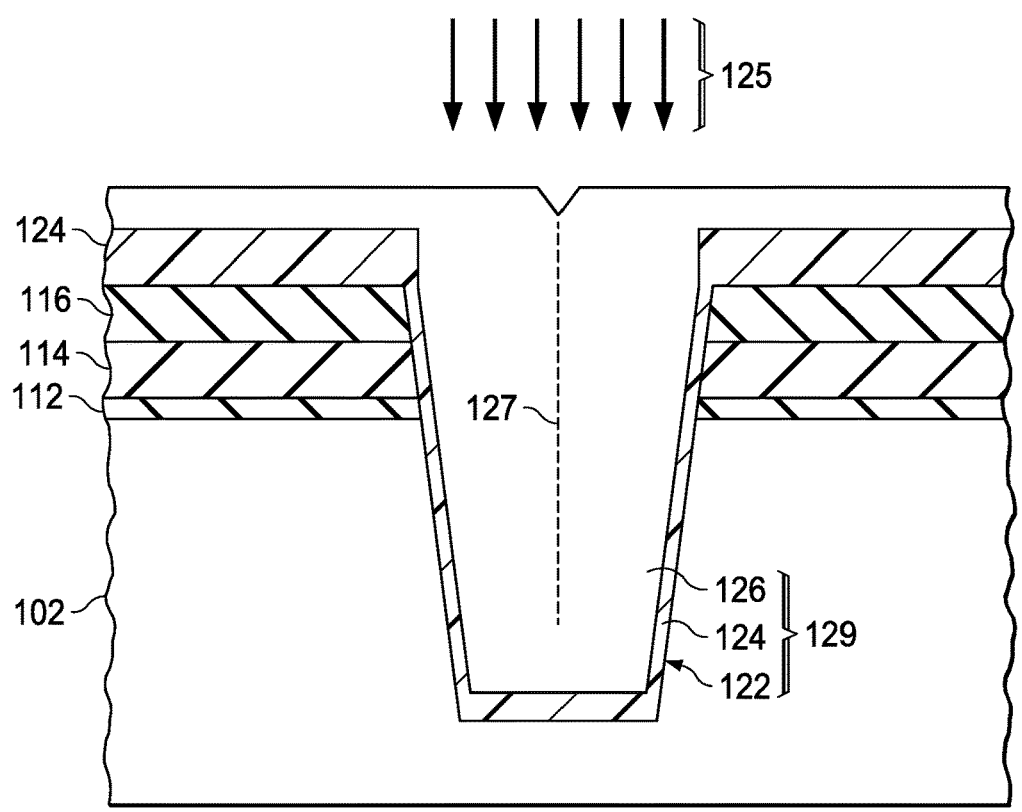

Referring to FIG. 1D, a polysilicon deposition process 125 is performed to fill the deep trench 122 with a conductive material. As a result, a DT filler structure 126 is formed in the deep trench 122. The DT filler structure 126 may contact the DT oxide liner 124. Alternatively, the DT filler structure 126 may directly contact the sidewall of the deep trench 122 where the DT oxide liner 124 is absent. During the polysilicon deposition process 125, a DT filler seam 127 may be formed along a vertical middle section of the FT filler structure 126. The dimensions of the DT filler seam 127 may depend on the aspect ratio of the deep trench 122.

After the DT filler structure 126 is formed, a chemical mechanical polish process is performed to remove excessive polysilicon material above the deep trench 122. At this point, a conductive deep trench 129 is formed. Then, the remaining nitride cap layer 114 and pad oxide layer 112 are removed and redeposited to complete the deep trench formation sequence and prepare for the shallow trench formation sequence.

Figure 1E:
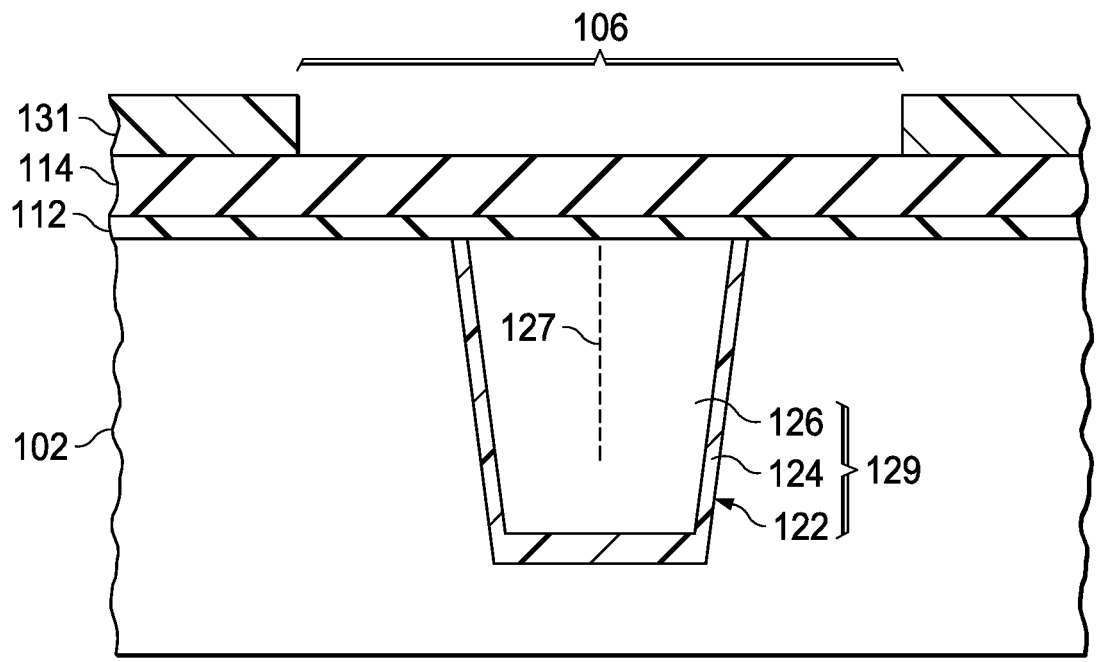
Figure 1F:
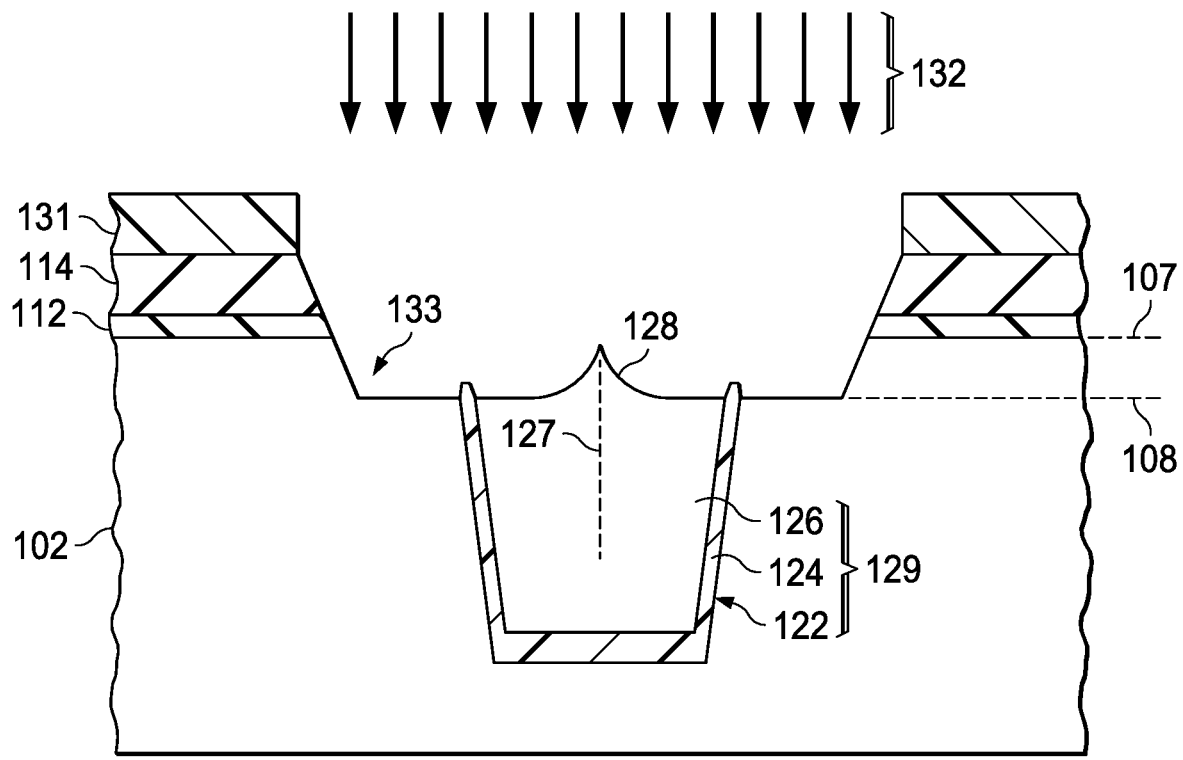

Referring to FIG. 1E, a photoresist mask 131 is deposited and patterned above the nitride cap layer 114 to expose a shallow trench (ST) region 106 of the semiconductor substrate 102. In general, the ST region 106 covers a wider area than the DT region 104, which may position completely within the ST region 106. After the photoresist mask 131 is patterned, a shallow trench etch process is performed. Referring to FIG. 1F, for example, a shallow trench etch process 132 may include a silicon etch to remove the nitride cap layer 114 and the pad oxide layer 112 exposed by the photoresist mask 131. During the silicon etch, the DT filler seam 127 may trap residuals from the nitride cap layer 114 and the pad oxide layer 112, which may in turn retard the etch rate around the DT filler seam 127. This slower etching may lead to the formation of one or more polysilicon cones 128 near the DT filler seam 127.

Figure 1G:
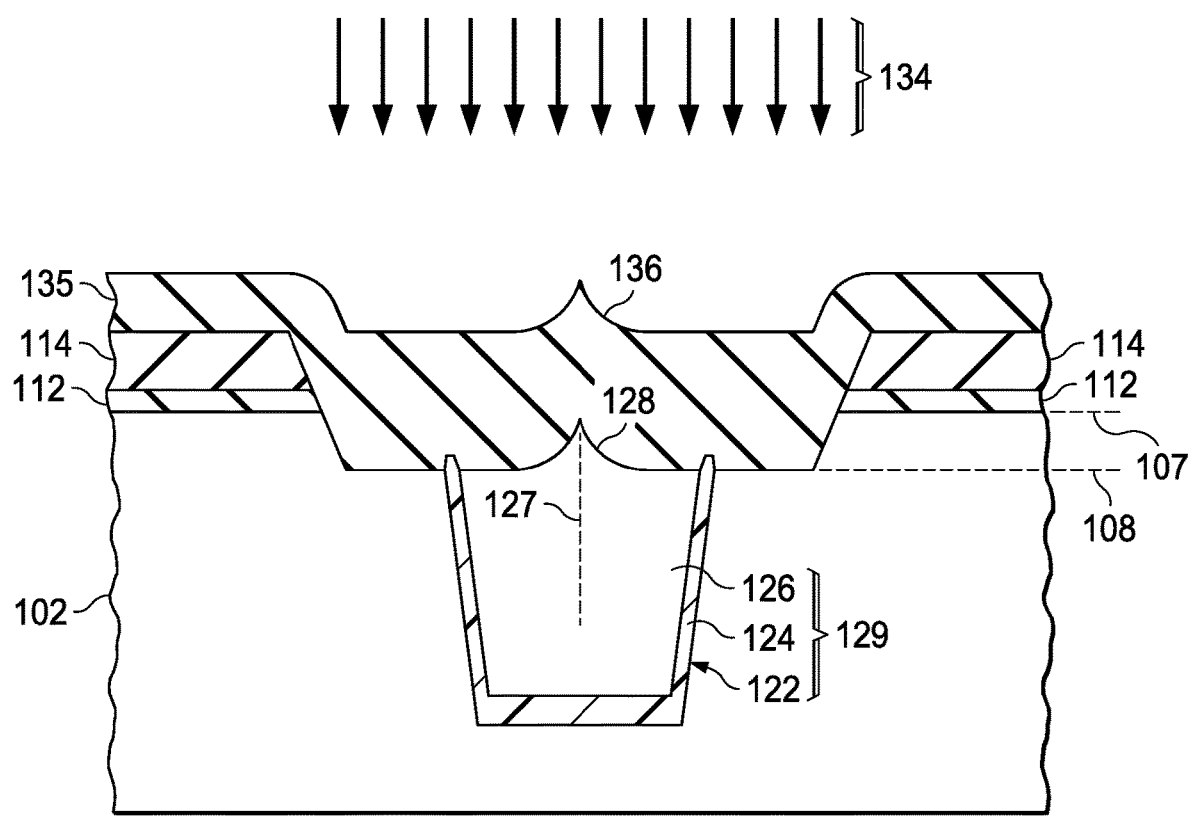

When the shallow trench etch 132 is completed, a shallow trench 133 is formed. And as a result of the shallow trench etch 132, the DT structure 129 recedes from a first plane 107, which aligns with the top surface of the substrate 102, to a second plane 108, which aligns with the bottom surface of the shallow trench 133. After the shallow trench 133 is formed, a dielectric liner may be deposited onto and aligns with the sidewall of the shallow trench 133. Then, as shown in FIG. 1G, a shallow trench fill process 134 is performed to fill the shallow trench 133 with a dielectric layer 135. The shallow trench fill process 134 may include a thermal oxide growth process or an oxide deposition process. Because of the polysilicon cone 128, the dielectric layer 135 may incur a dielectric cone 136 protruding from the top surface of the dielectric layer 135.

FIG. 1G only shows a single dielectric cone 136 and a single polysilicon cone 128, but in reality, a semiconductor device (e.g., device 100) fabricated under the process steps as shown above may incur many more dielectric cones and silicon cones in a small area. The dielectric cones may be subsequently removed during a chemical mechanical polish process. Nevertheless, the polysilicon cone 128 remains under the dielectric layer 135. As the dielectric layer 135 is mostly transparent, the polysilicon cone 128 is visible or detectable by one or more inspection devices. Thus, the polysilicon cone 128 may obstruct one or more inspection processes for detecting structural defects of the semiconductor device. As a result, yield related issues may remain undetected by the inspection processes. These undetected yield related issues will ultimately impact the yield of a mass production of the semiconductor devices.

Figure 2A:
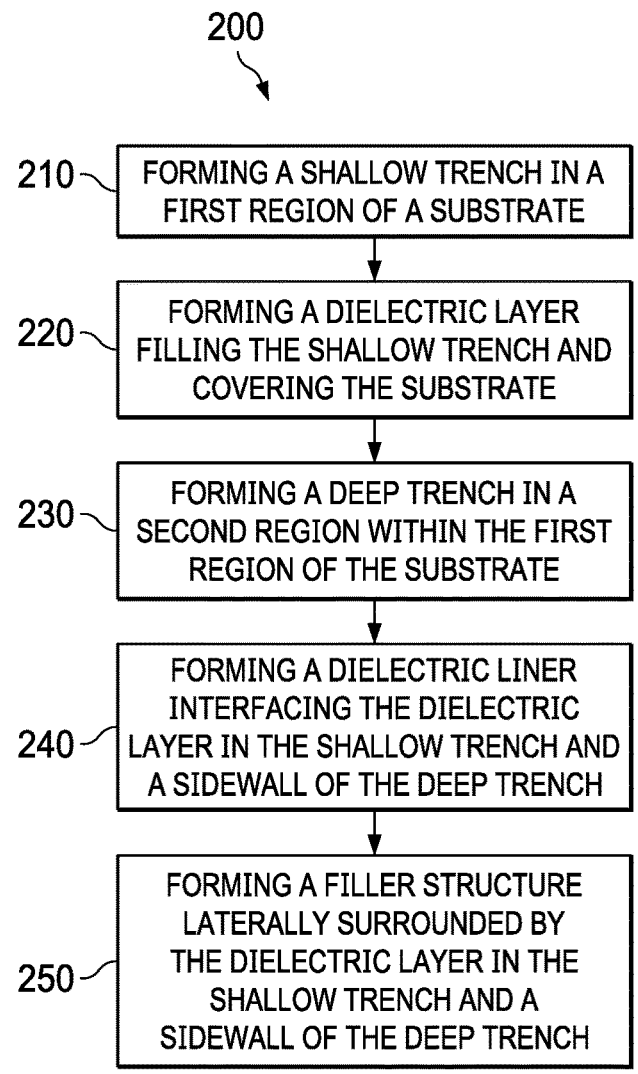
FIG. 2A shows a flow chart of an example method for fabricating a shallow trench followed by a deep trench free of cone defects according to an aspect of the present disclosure.

To reduce or eliminate inspection issues related to cone formation, the present disclosure introduces a method of fabricating a semiconductor device with overlapping shallow trench and deep trench structures that can prevent cone formation. According to an aspect of the present disclosure, FIG. 2A shows a flow chart of an example method 200 for fabricating a shallow trench followed by a deep trench free of cone defects. The method 200 begins at step 210, which involves forming a shallow trench in a first region of a substrate. Unlike the process as depicted in FIGS. 1A-1G, the method 200 arranges the shallow trench to be formed before the deep trench. For illustration, FIGS. 3A-3I show the partial cross-sectional views of an example semiconductor device 300 during a fabrication process that implements the method 200.

Figure 3A:
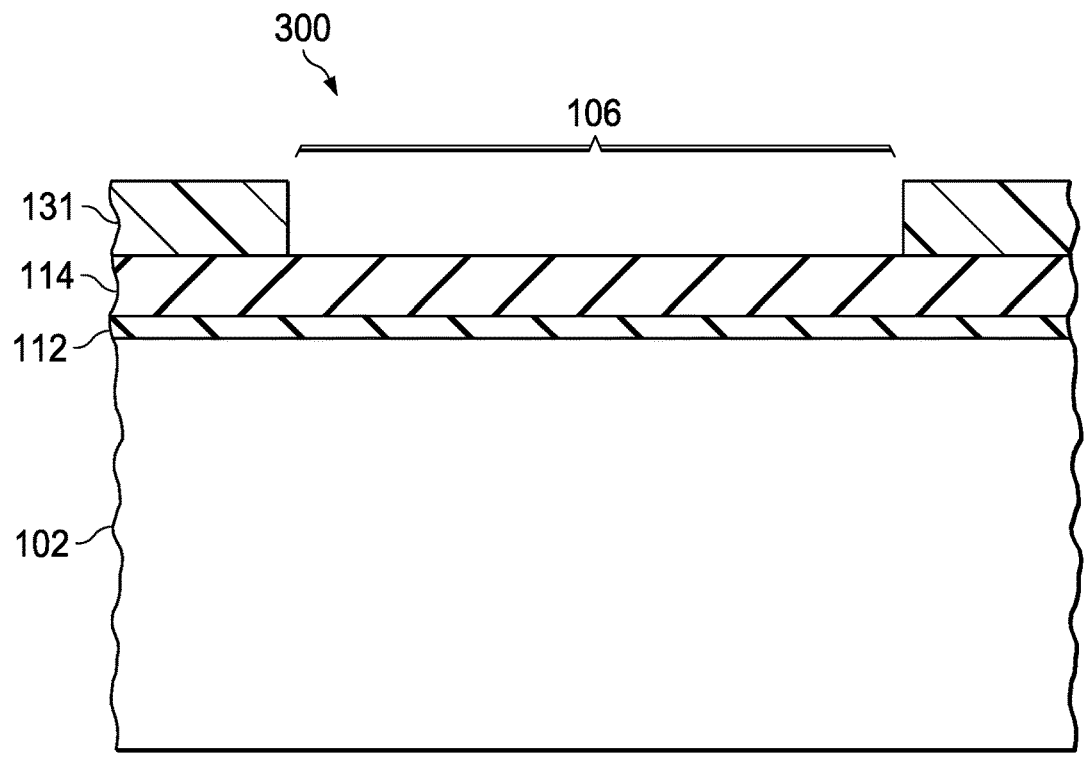
FIGS. 3A-3I show the partial cross-sectional views of an example semiconductor device during a fabrication process that implements the example method of FIGS. 2A and 2B according to an aspect of the present disclosure.

Referring to FIG. 3A, for example, the semiconductor device 300 is at an early stage of a fabrication process. The semiconductor device 300 can be a discrete component device (e.g., a single transistor device) or an integrated circuit having multiple transistor devices. Before step 210 is performed, a pad oxide layer 112, and a nitride cap layer 114 are sequentially formed on a top surface of a semiconductor substrate 102. The process parameters for forming the pad oxide layer 112, and the cap nitride layer 114 are essentially the same as described in association with FIG. 1A.

Figure 3B:
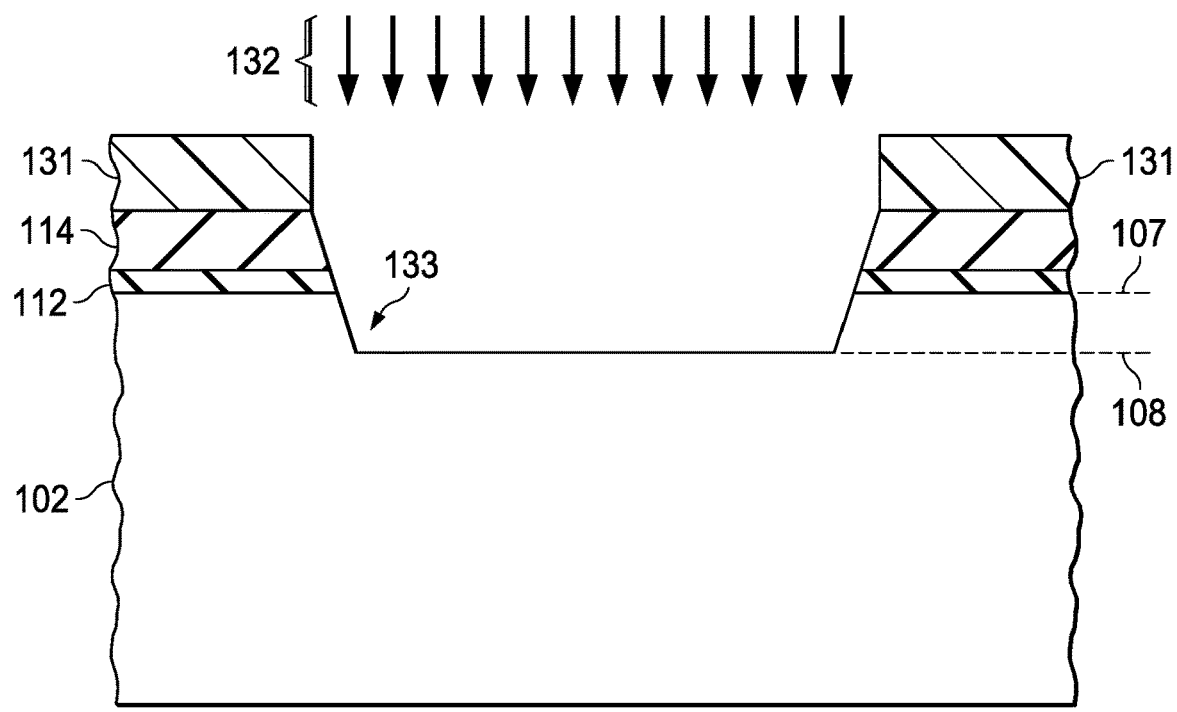

During step 210, a photoresist mask 131 is deposited and patterned with an opening exposing a shallow trench (ST) region 106 (e.g., first region) of the substrate 102. After the photoresist mask 131 is patterned, a shallow trench etch process is performed. Referring to FIG. 3B, for example, a shallow trench etch process 132 may include a silicon etch to remove the nitride cap layer 114, and the pad oxide layer 112 as exposed by the photoresist mask 131. When the shallow trench etch 132 is completed, a shallow trench 133 is formed.

Next, the method 200 proceeds to step 220, which involves forming a dielectric layer filling the shallow trench and covering the substrate. According to an aspect of the present disclosure, the dielectric layer has a substantially planar surface positioned over and extending across the shallow trench. The substantially planar surface advantageously allows the photoresist mask for etching a deep trench to be deposited and patterned more accurately. While step 220 can be performed by forming a single dielectric layer that fills the shallow trench (e.g., shallow trench 133), multiple dielectric layers may be formed during step 220 as well.

Figure 2B:
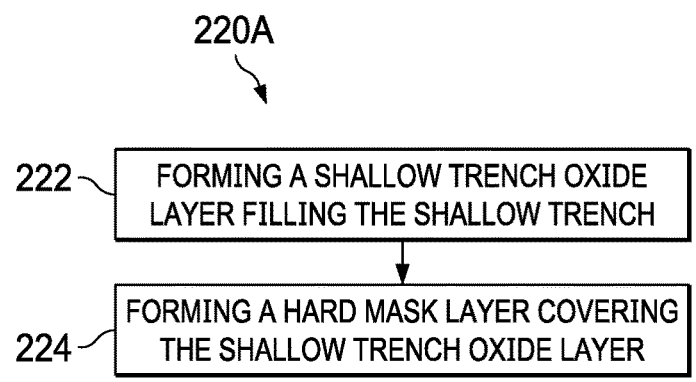
FIG. 2B shows a flow chart of an example method for forming a dielectric layer filling the shallow trench and covering the substrate according to an aspect of the present disclosure.
Figure 3C:
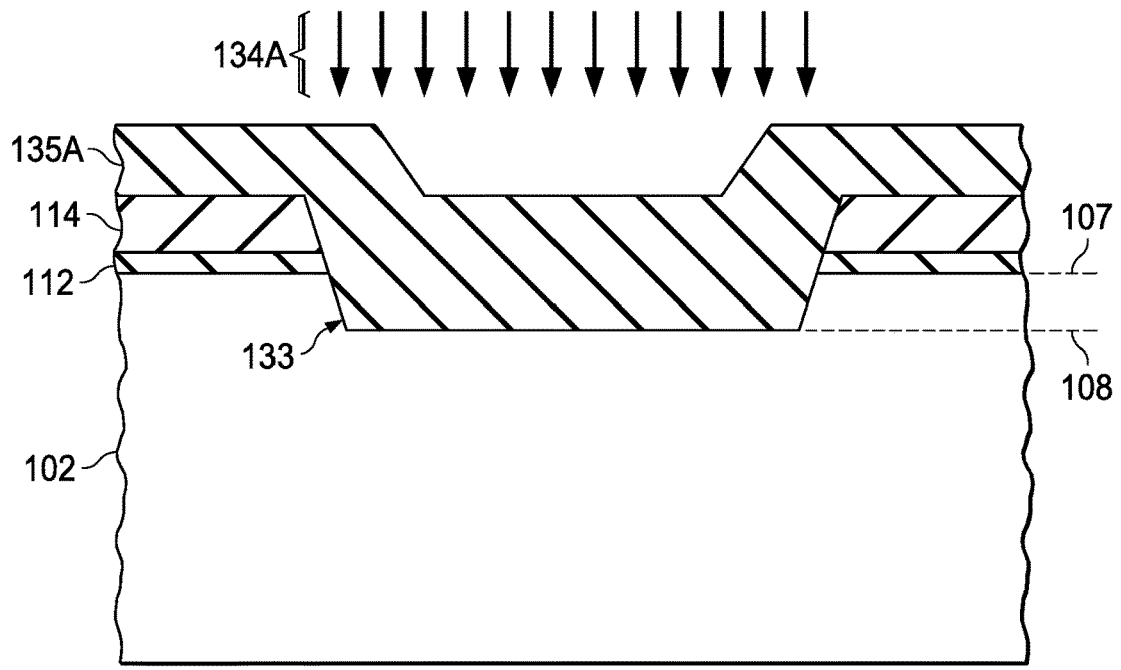

For example, FIG. 2B shows a method 220A for forming at least two dielectric layers that fills the shallow trench and covering the substrate. The method 220A begins at step 222, which involves forming a shallow trench oxide layer filling the shallow trench. The shallow trench oxide layer may be considered as a first oxide layer that fills the shallow trench, and it may be thermally grown onto the etched surface of the shallow trench. As shown in FIG. 3C, for example, a first dielectric formation process 134A is performed to formed a first dielectric layer 135A. The first dielectric formation process 134A may be a thermal oxidation process or an oxide deposition process (e.g., high density plasma deposition). The first dielectric layer 135A is a shallow trench oxide layer as it fills the entire shallow trench 133, which is positioned between a first plane 107 and a second plane 108 of the substrate 102. The first plane 107 aligns along a top surface of the substrate 102, whereas the second plane 108 aligns along a bottom surface of the shallow trench 133.

After forming the shallow trench oxide layer, the method 220A proceeds to step 224, which involves forming a hard mask layer covering the shallow trench oxide layer. The hard mask layer may be considered as a second oxide layer that covers the first oxide layer. In one implementation, the second oxide layer may have a lower oxide density than the first oxide layer. The cost of forming an oxide layer with a lower oxide density is lower than the cost of forming an oxide layer with a higher oxide density. Advantageously, the two-step approach provided by the method 220A helps reduce the cost of forming a dielectric layer that fills and covers the shallow trench as prescribed by step 220 in the method 200.

Figure 3D:
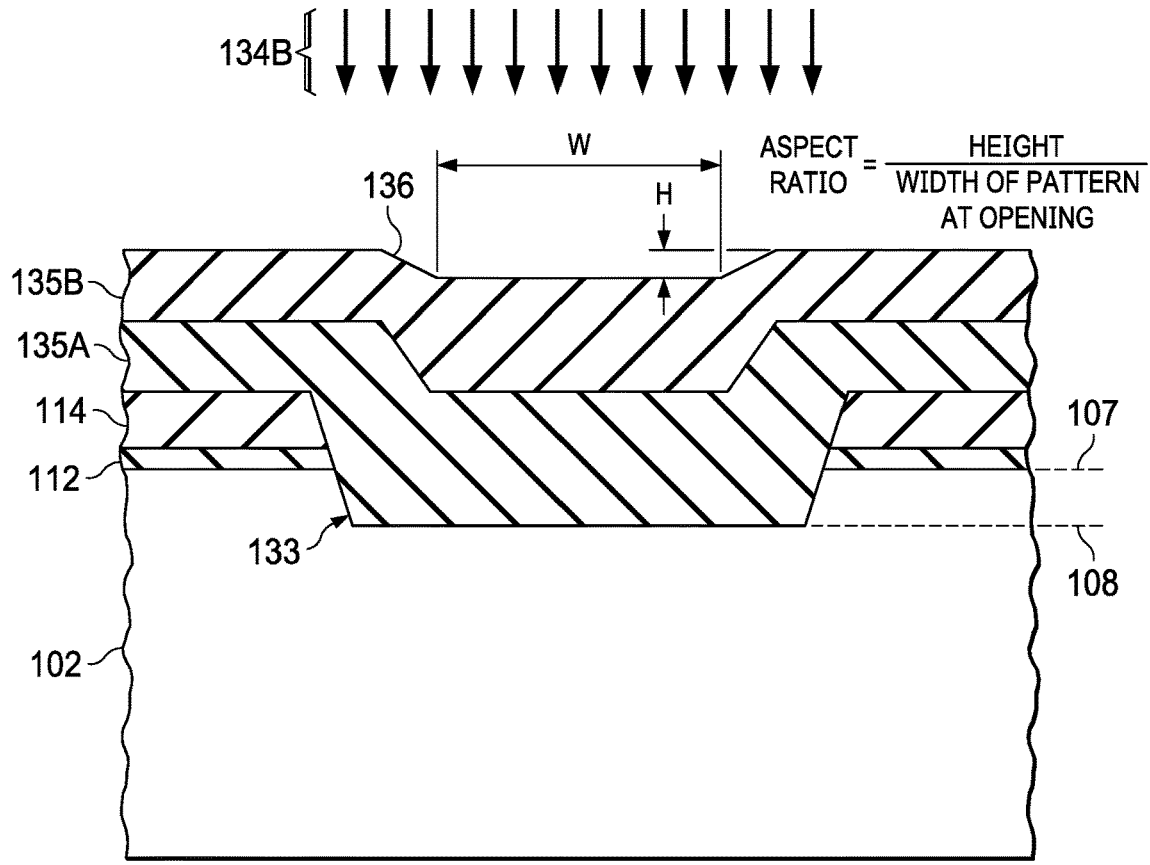

As shown in FIG. 3D, for example, a second dielectric formation process 134B is performed to formed a second dielectric layer 135B. The second dielectric formation process 134B may be a thermal oxidation process or an oxide deposition process (e.g., TEOS plasma enhanced chemical vapor deposition). The second dielectric layer 135B is a hard mask layer as it serves the function of a hard mask during a subsequent deep trench etching process. The second dielectric layer (or hard mask layer) 135B has a substantially planar surface 136. According to an aspect of the present disclosure, the surface of the second dielectric layer (or hard mask layer) 135B is substantially planar when it is sufficiently flat to allow accurate placement and patterning of a photoresist mask for the purpose of etching a deep trench within the shallow trench 133. In particular, the substantially planar surface 136 may have an aspect ratio defined by a height (H) of the surface over a width (W) that is sufficiently wide to serve as a deep trench aperture.

In one implementation, for example, the second dielectric layer (or hard mask layer) 135B has a substantially planar surface 136 where the aspect ratio is less than 0.4. In another implementation, for example, the second dielectric layer (or hard mask layer) 135B has a substantially planar surface 136 where the aspect ratio is less than 0.2. In yet another implementation, for example, the second dielectric layer (or hard mask layer) 135B has a substantially planar surface 136 where the aspect ratio is less than 0.1. The substantially planar surface 136 can be achieved by adjusting several process parameters for forming the first and/or second dielectric layers 135A and 135B. For example, the substantially planar surface 136 may be achieved where the second dielectric layer 135B has a thickness that is equal to or greater than that of the first dielectric layer 135A.

Figure 3E:
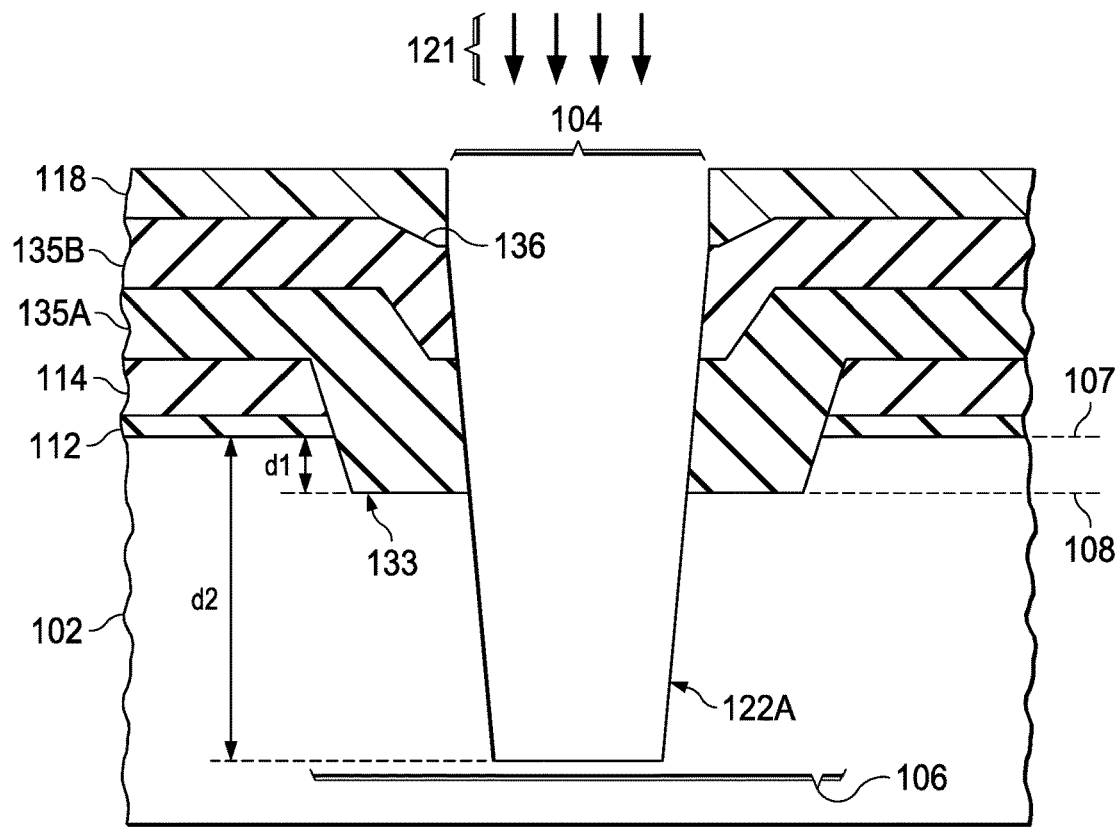

Referring again to FIG. 2A, the method 200 proceeds to step 230, which involves forming a deep trench in a second region within the first region of the substrate. As shown in FIG. 3E, for example, a deep trench (DT) etch process 121 is performed to form a deep trench 122A within a deep trench region 104, which can be a second region within the first region (e.g., 106) of the substrate 102. The DT etch process 121 may include multiple subsequences. In one implementation, for example, a hard mask etch may be first performed to remove the second and first dielectric layer 135B and 135A as exposed by the patterned photoresist mask 118, and a silicon etch may then be performed to remove the substrate 102 that is exposed by the second dielectric layer 135B, which serves as a hard mask layer. During the silicon etch, the photoresist mask layer 118 is also removed, leaving the second dielectric layer (or hard mask layer) 135B to prevent the area outside of the DT region 104 from being etched.

As a result of the DT etch process 121, the deep trench 122A extends from and penetrating through the second and first dielectric layers 135B and 135A. The deep trench 122A has a trench depth d2 that is greater than a trench depth d1 of the shallow trench 133, whereas the shallow trench 133 has a trench aperture (e.g., less than the width of the ST region 106) that is wider than a trench aperture (e.g., less than the width of the DT region 104) of the deep trench 122A.

According to an aspect of the present disclosure, the DT etch process 121 is integrated with the shallow trench isolation process (e.g., steps 210-220; FIGS. 3A-3D). The disclosed integration provides multiple advantages from a process standpoint. First, the disclosed integration reduces the total number of process steps for fabricating a deep trench structure within a shallow trench structure. For instance, the re-depositions of the pad oxide layer 112 and the cap nitride layer 114 (see, e.g., FIGS. 1D-1E) can be eliminated. This is because the shallow trench dielectric layer (e.g., 135A and 135B) may serve the functions of the pad oxide and cap nitride layers 112 and 114 during the DT etch process 121.

Second, the sequence of forming a deep trench after a shallow trench also helps prevent cone formation. As shown in subsequent figures, this is because the deep trench filler structure 126A is no longer etched and then covered by the shallow trench dielectric layer (e.g., 135A and 135B), which reduces the chances that the etch contaminants to be trapped and built up within the DT filler seam 127A of the DT structure 129A.

Third, the disclosed integration process overcomes a phenomenon known as deep trench pattern distortion due to photoresist thickness variation over the shallow trench dielectric layer (e.g., 135A and 135B). By forming the photoresist mask 118 over a substantially planar surface 136 of the second dielectric layer (or hard mask layer) 135B, the deep trench pattern size (e.g., opening exposing the DT region 106) can be critically controlled to achieve deep trench etch depth uniformity.

Figure 3F:
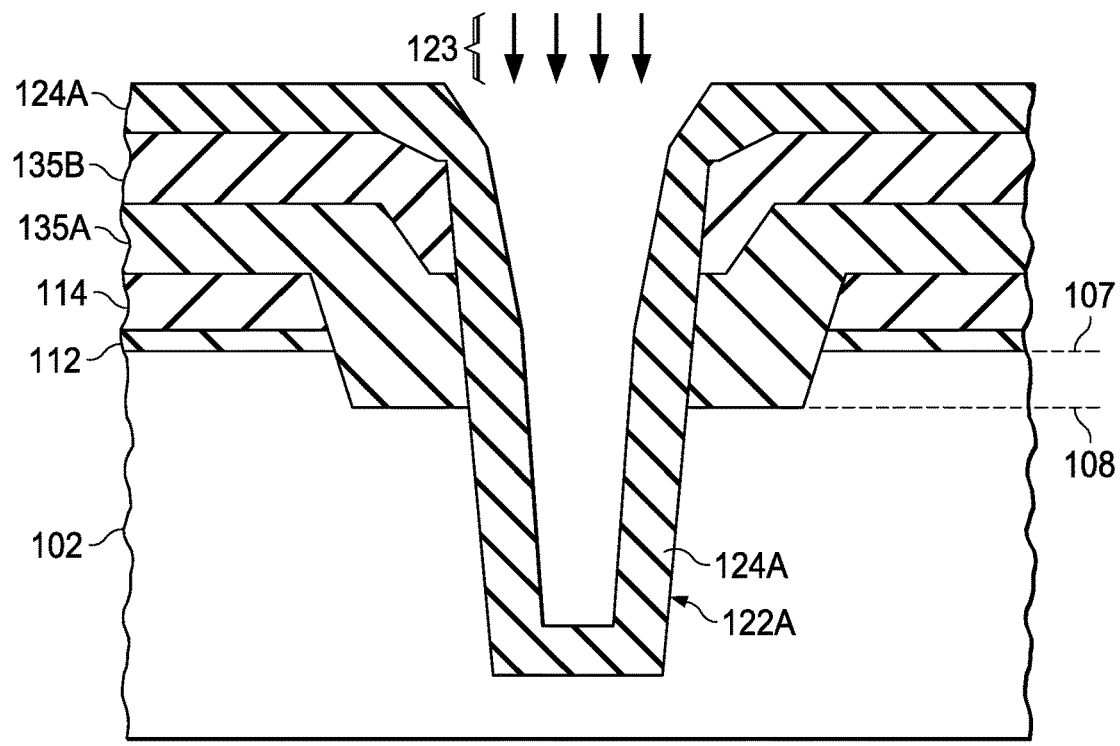

After forming the deep trench, the method 200 proceeds to step 240, which involves forming a dielectric liner interfacing the dielectric layer in the shallow trench and a sidewall of the deep trench. As shown in FIG. 3F, for example, a DT oxide liner 124A is deposited onto the etched sidewalls of the dielectric layers 135A and 135B and onto the sidewall of the deep trench 122A under a dielectric liner deposition process 123. In one implementation, the dielectric liner deposition 123 may include a sub-atmospheric chemical vapor deposition of an oxide target.

Unlike the DT oxide liner 124 as shown in FIGS. 1E and 1F, which is positioned under the shallow trench 133, the DT oxide liner 124A extends upward to interface the first and second dielectric layers 135A and 135B within and over the shallow trench 133. The dielectric liner deposition process 123A may be followed by a deep trench dielectric etch process to achieve uniform liner thickness along the sidewall of the deep trench 122A.

Figure 3G:
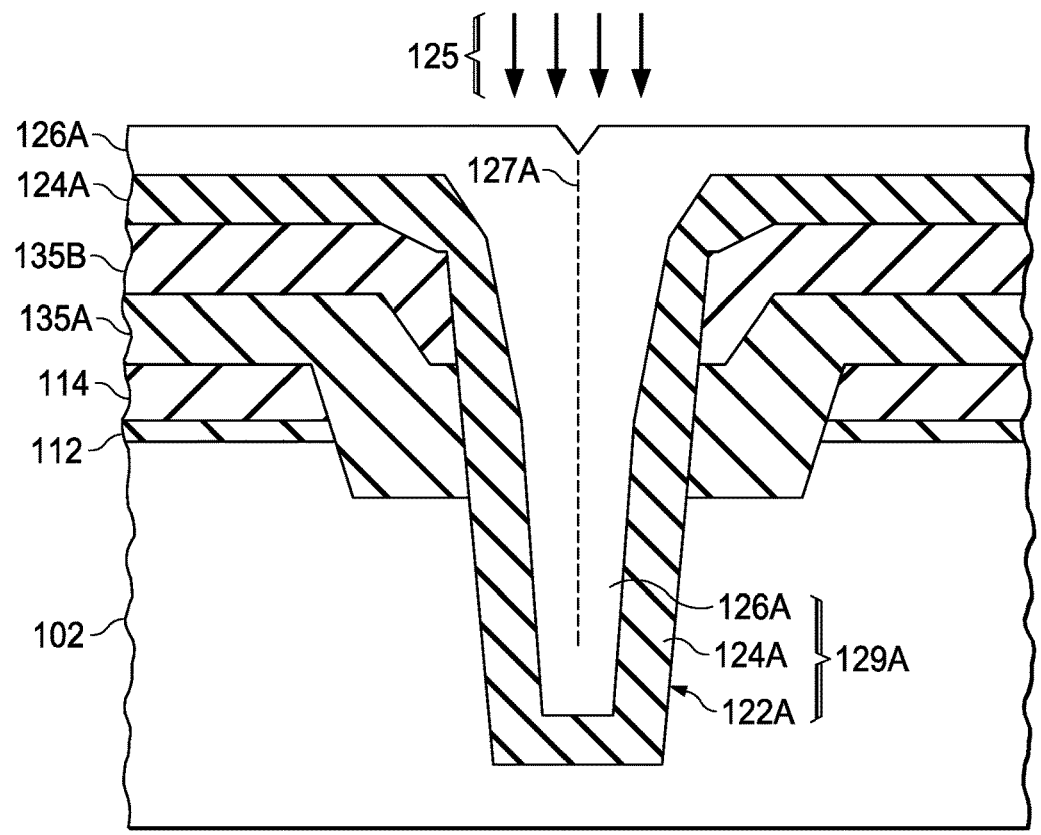

After the formation of the dielectric liner, the method 200 proceeds to step 250, which involves forming a filler structure laterally surrounded by the dielectric layer in the shallow trench and a sidewall of the deep trench. As shown in FIG. 3G, for example, a polysilicon deposition process 125 is performed to fill the deep trench 122A with a conductive material. As a result, a DT filler structure 126A is formed in the deep trench 122A. The DT filler structure 126A may contact the DT oxide liner 124A and be laterally surrounded by the dielectric layers 134A and 135B. During the polysilicon deposition process 125, a DT filler seam 127A may be formed along a vertical middle section of the FT filler structure 126A. The dimensions of the DT filler seam 127A may depend on the aspect ratio of the deep trench 122A. Unlike the DT filler seam 127 as shown and described in FIGS. 1F-1G, the DT filler seam 127A will not be subjected to further etching. As such, the DT filler seam 127A is unlikely to contribute to subsequent cone formations as shown and described in FIG. 1G.

Figure 3H:
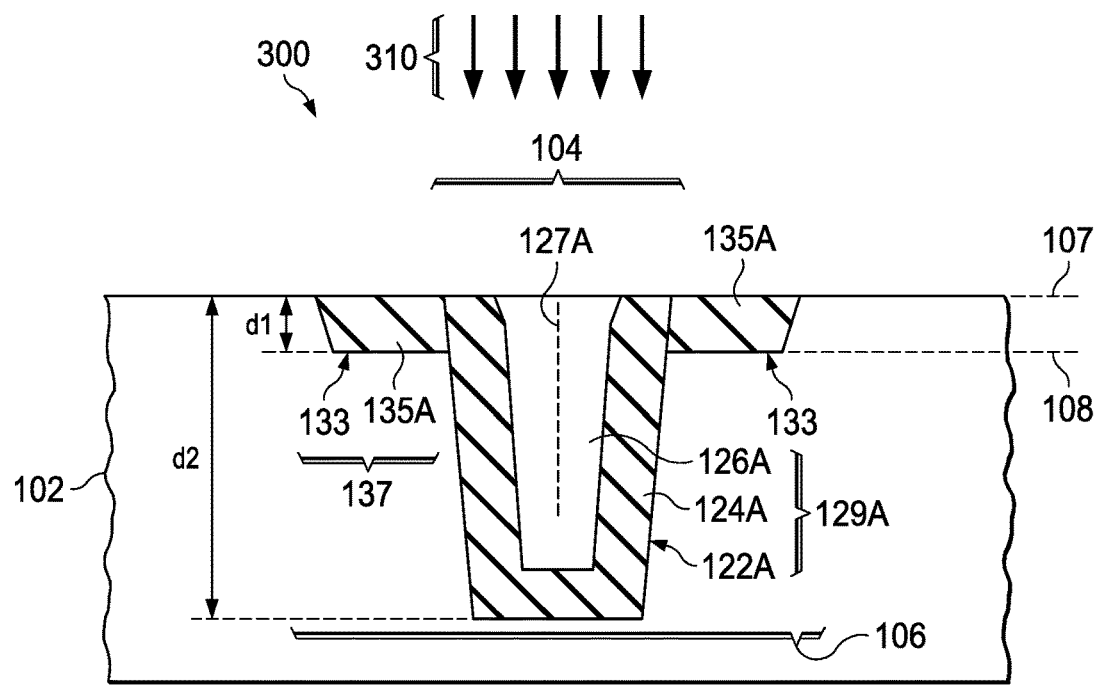

After the DT filler structure 126 is formed, a chemical mechanical polish process is performed to remove excessive polysilicon material above the deep trench 122. Referring to FIG. 3H, for example, a chemical mechanical polish process 310 is performed to remove the remaining nitride cap layer 114 and pad oxide layer 112. After the chemical mechanical polish process 310, the semiconductor device 300 includes a deep trench structure 129A extending downward and within a shallow trench structure 137. The shallow trench structure 137 includes a shallow trench dielectric layer 135A that extends from a first plane 107 that aligns with a top surface of the substrate 102. The shallow trench structure 137 further extends into the substrate 102 by a first depth d1. The deep trench structure 129A extends from the first plane 107 that aligns with a top surface of the substrate 102. The deep trench structure 129 penetrates through the shallow trench dielectric layer 135A and a second plane 108 that aligns with the bottom surface of the shallow trench 133. The deep trench structure 129 further extends into the substrate 102 by a second depth d2, which is greater than the first depth d1.

The DT filler structure 126A of the deep trench structure 129A includes a polysilicon plate having an upper portion and a lower portion. The upper portion has a first width, and it is positioned within in the shallow trench 133. The lower portion has a second width, and it is positioned within in the deep trench 122A. In one implementation, the first width is greater than the second width. The DT oxide liner 124A interfaces between the upper portion of the polysilicon plate and the shallow trench dielectric layer 135A. Moreover, the DT oxide liner 124A also interfaces between the lower portion of the polysilicon plate and the substrate 102. In one implementation, the DT oxide liner 124A has a lower oxide density than the shallow trench dielectric layer 135A.

Figure 3I:
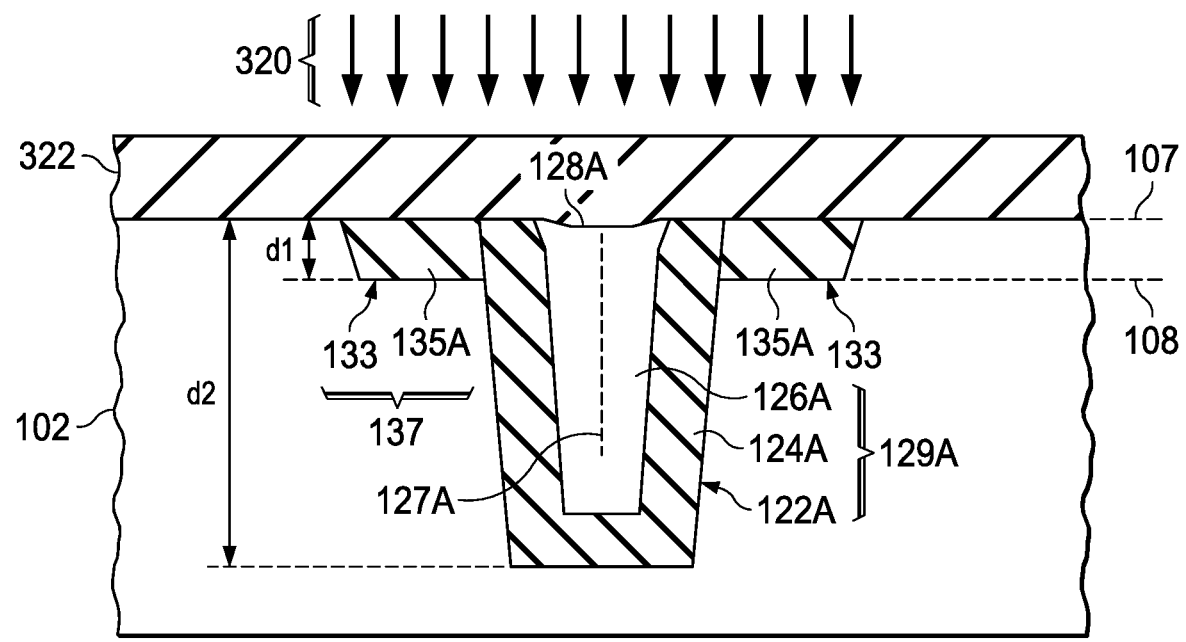

At this stage of the fabrication process (see, e.g., FIG. 3H), the semiconductor device 300 is substantially cone free around the top surface of the deep trench structure 129 as well as the shallow trench structure 137. The semiconductor device 300 can be prepared for further processing, which may include the formation of one or more dielectric layers above the deep trench structure 129 as well as the shallow trench structure 137. Referring to FIG. 3I, for example, a dielectric deposition process 320 may be performed to form a dielectric layer 322 that covers a DT top surface 128A as well as a top surface of the substrate 102 and the shallow trench structure 137. In the event that the DT filler structure 126A is not further etched, any subsequent deposition of dielectric layer is unlikely to cause any cone formation thereon.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

Furthermore, terms of relativity, such as "about," "approximately," "substantially," "near," "within a proximity," "sufficient . . . to," "maximum," and "minimum," as applied to features of an integrated circuit and/or a semiconductor device can be understood with respect to the fabrication tolerances of a particular process for fabricating the integrated circuit and/or the semiconductor device. In addition, these terms of relativity can be understood within a framework for performing one or more functions by the integrated circuit and/or the semiconductor device.

More specifically, for example, the terms "substantially the same," "substantially equals," and "approximately the same" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A method, comprising:
   forming a shallow trench in a first region of a substrate;
   forming a dielectric layer filling the shallow trench and covering the substrate, the dielectric layer having a substantially planar surface over and across the shallow trench; and
   forming a deep trench in a second region within the first region of the substrate, the deep trench extending from and penetrating through the dielectric layer.

2. The method of claim 1, wherein the forming the dielectric layer includes:
   forming a shallow trench oxide layer filling the shallow trench; and
   forming a hard mask layer covering the shallow trench oxide layer, the hard mask layer having the substantially planar surface.

3. The method of claim 1, wherein the forming the dielectric layer includes:
   thermally growing a shallow trench oxide layer filling the shallow trench; and
   depositing a hard mask layer covering the shallow trench oxide layer, the hard mask layer having the substantially planar surface.

4. The method of claim 1, wherein the forming the dielectric layer includes:
   forming a first oxide layer filling the shallow trench; and
   forming a second oxide layer covering the first oxide layer, the second oxide layer having a lower oxide density than the first oxide layer.

5. The method of claim 1, wherein the substantially planar surface has an aspect ratio less than 0.4.

6. The method of claim 1, wherein:
   the deep trench has a deeper trench depth than the shallow trench; and
   the shallow trench has a wider trench aperture than the deep trench.

7. The method of claim 1, further comprising:
   forming a dielectric liner interfacing the dielectric layer in the shallow trench and a sidewall of the deep trench.

8. The method of claim 7, wherein the forming the dielectric liner includes performing a sub-atmospheric chemical vapor deposition of an oxide material onto the dielectric layer in the shallow trench and onto the sidewall of the deep trench.

9. The method of claim 1, further comprising:
   forming a filler structure laterally surrounded by the dielectric layer in the shallow trench and a sidewall of the deep trench.

10. The method of claim 9, wherein the filler structure includes a polysilicon plate having a first width in the shallow trench and a second width in the deep trench, and the first width is greater than the second width.

11. A method, comprising:
    forming a shallow trench in a first region of a substrate;
    forming a shallow trench oxide layer filling the shallow trench;
    forming a hard mask layer covering the shallow trench oxide layer, the hard mask layer having a substantially planar surface; and
    forming a deep trench in a second region within the first region of the substrate, the deep trench extending from and penetrating through the shallow trench oxide layer.

12. The method of claim 11, wherein the hard mask layer has a lower oxide density than the shallow trench oxide layer.

13. The method of claim 1, wherein the substantially planar surface has an aspect ratio less than 0.4.

14. The method of claim 11, wherein:
    the deep trench has a deeper trench depth than the shallow trench; and
    the shallow trench has a wider trench aperture than the deep trench.

15. The method of claim 11, further comprising:
    performing a sub-atmospheric chemical vapor deposition of an oxide material onto the shallow trench oxide layer in the shallow trench and onto a sidewall of the deep trench.

16. The method of claim 11, further comprising:
    forming a polysilicon plate having a first width in the shallow trench and a second width in the deep trench, and the first width is greater than the second width.

17. A device, comprising:
    a substrate having a surface aligning along a plane;
    a shallow trench dielectric layer extending from the plane into the substrate by a first depth; and
    a deep trench structure extending from the plane, through the shallow trench dielectric layer, and into the substrate by a second depth greater than the first depth.

18. The device of claim 17, wherein the deep trench structure includes:
    a polysilicon plate having: an upper portion laterally surrounded by the shallow trench dielectric layer, and a lower portion below the shallow trench dielectric layer, the upper portion having a greater width than the lower portion.

19. The device of claim 17, wherein the deep trench structure includes:

a polysilicon plate having an upper portion laterally surrounded by the shallow trench dielectric layer and a lower portion below the upper portion; and an oxide liner interfacing between the upper portion of the polysilicon plate and the shallow trench dielectric layer, and interfacing between the lower portion of the polysilicon plate and the substrate.

20. The device of claim 19, wherein the oxide liner has a lower oxide density than the shallow trench dielectric layer.

* * * * *